(12) United States Patent
Shoji et al.

(10) Patent No.: US 6,804,074 B2
(45) Date of Patent: Oct. 12, 2004

(54) PLL CIRCUIT AND RECORDING AND PLAYBACK APPARATUS USING SAME

(75) Inventors: Norio Shoji, Kanagawa (JP); Junkichi Sugita, Kanagawa (JP); Kimimasa Senba, Kanagawa (JP); Toshihiro Kawakubo, Kanagawa (JP)

(73) Assignee: Sony Corporation, Tokyo (JP)

( * ) Notice: Subject to any disclaimer, the term of this patent is extended or adjusted under 35 U.S.C. 154(b) by 554 days.

(21) Appl. No.: 09/862,422

(22) Filed: May 23, 2001

(65) Prior Publication Data

US 2002/0017934 A1 Feb. 14, 2002

(30) Foreign Application Priority Data

May 24, 2000 (JP) ..................................... P2000-152309

(51) Int. Cl.[7] .......................... G11B 5/09; G11B 20/14; H03L 7/06; H03L 7/08; H03L 7/14
(52) U.S. Cl. ........................................ 360/51; 327/156
(58) Field of Search ............................... 360/51, 78.02, 360/46; 327/156; 331/18, 25

(56) References Cited

U.S. PATENT DOCUMENTS 5,841,323 A * 11/1998 Fujimoto ..................... 331/11
6,337,682 B1 * 1/2002 Hwang ........................ 345/213

FOREIGN PATENT DOCUMENTS

JP 07007686 A * 1/1995 .......... H04N/5/455

* cited by examiner

*Primary Examiner*—David Hudspeth
*Assistant Examiner*—Dan I. Davidson
(74) *Attorney, Agent, or Firm*—Rader, Fishman & Grauer PLLC; Ronald P. Kananen

(57) ABSTRACT

A PLL circuit functioning as a clock recovery circuit in a tape recording and playback apparatus employing the PRML method has a level determining circuit for detecting that head output level (signal level) is at or lower than a certain level during track crossing for a high-speed search, and effects a hold on a loop filter according to a level determination output to thereby hold PLL operation, whereby the PLL behavior is not disturbed by a noise component occurring during track crossing. Thus, it is possible to stabilize search operation and increase the design margin.

11 Claims, 15 Drawing Sheets

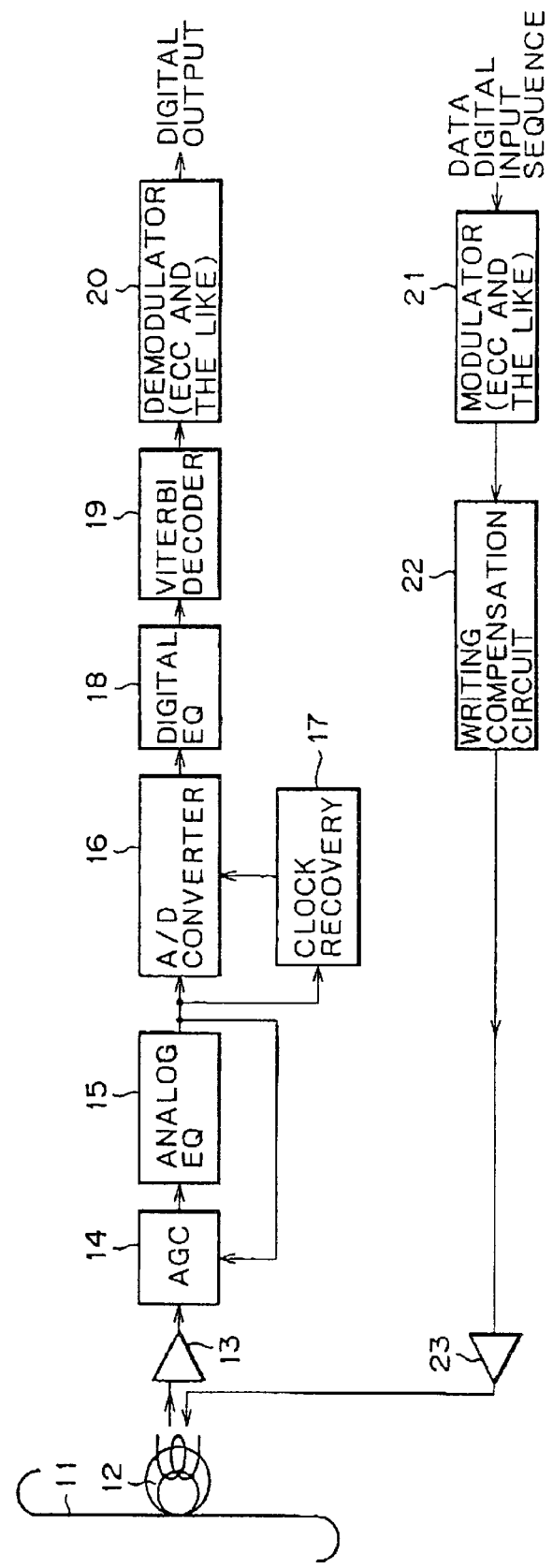

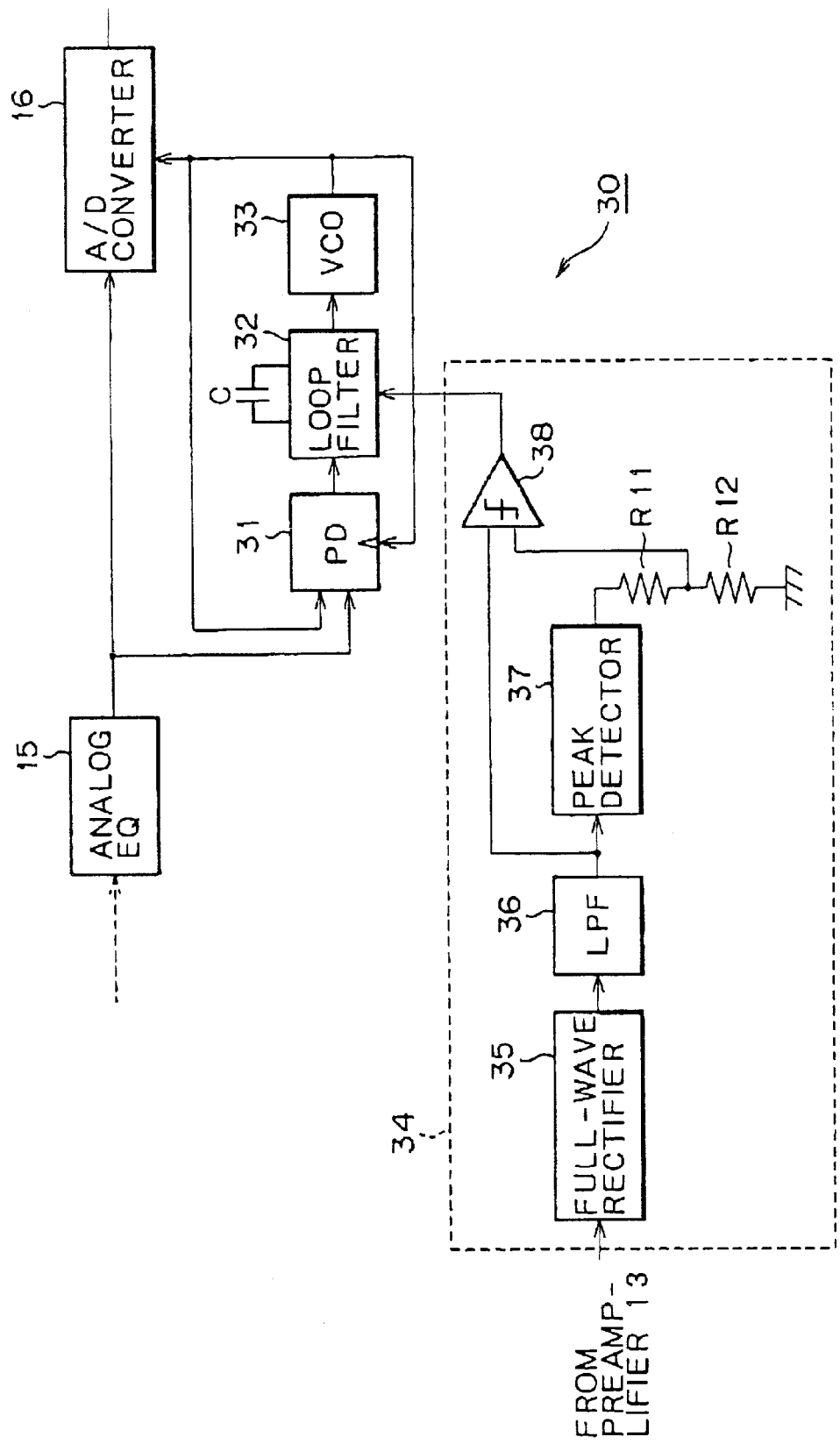

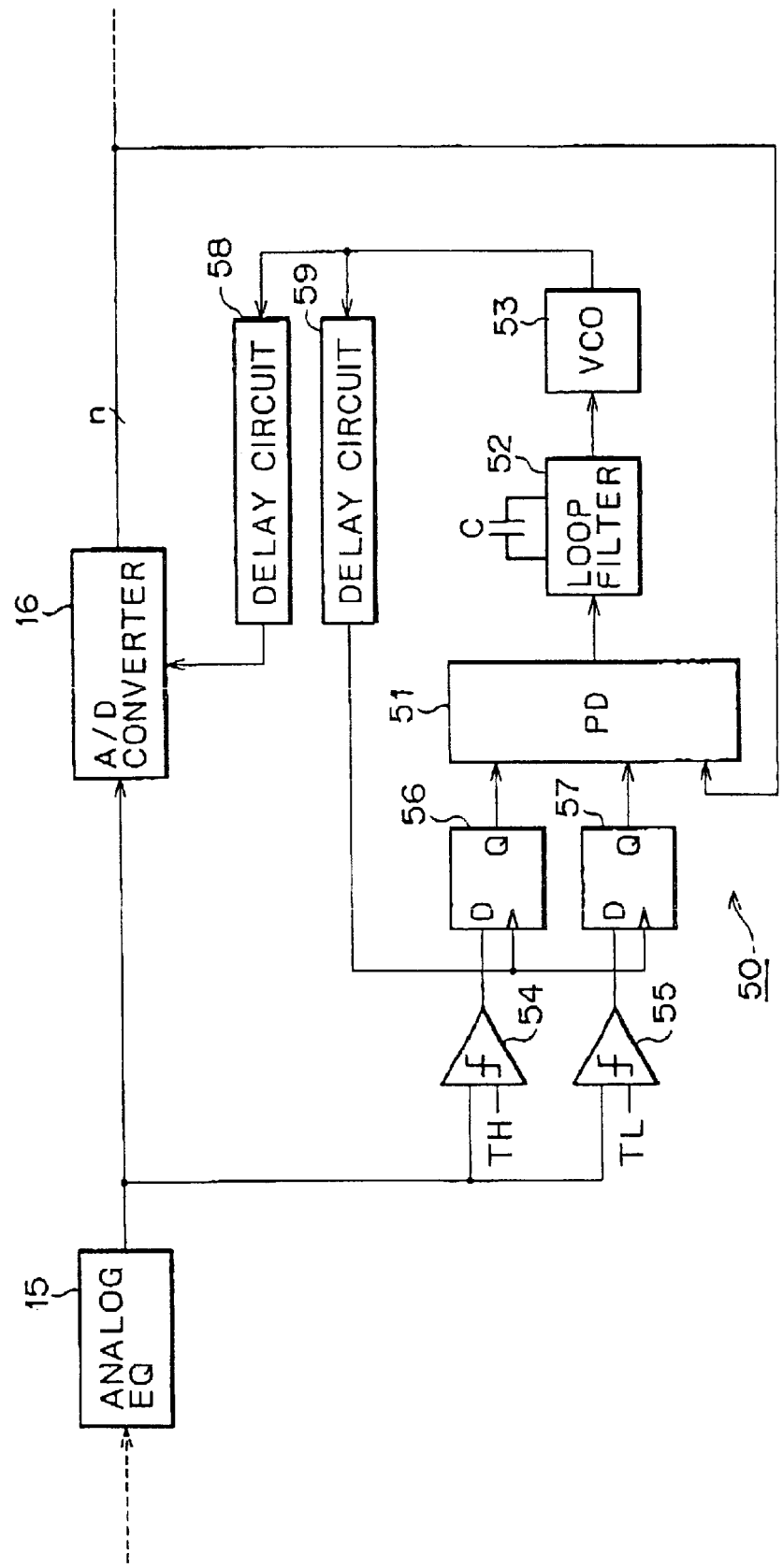
F I G. 5

F I G. 8
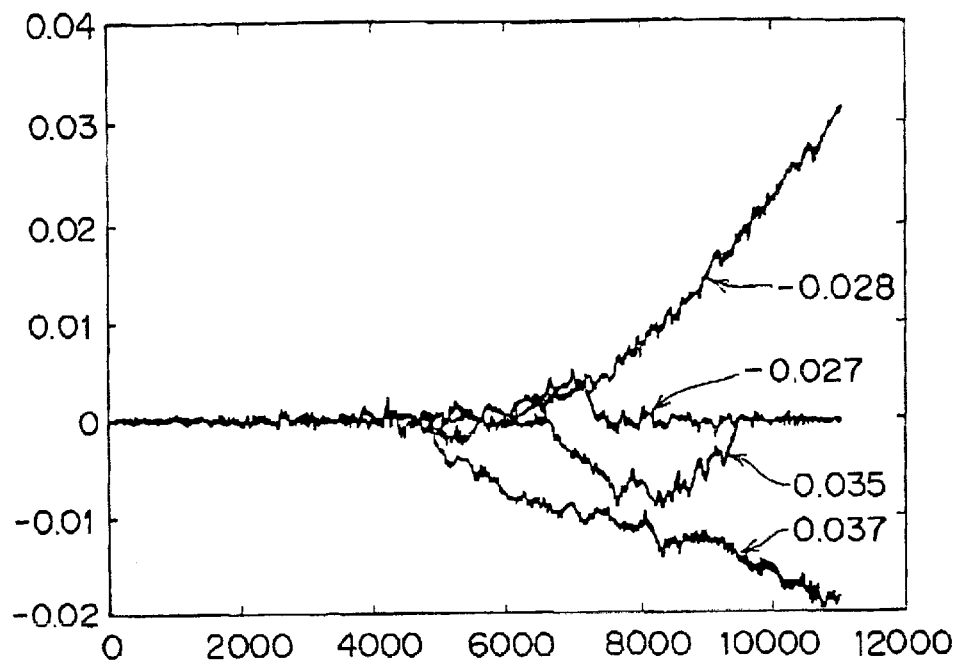
F I G. 9
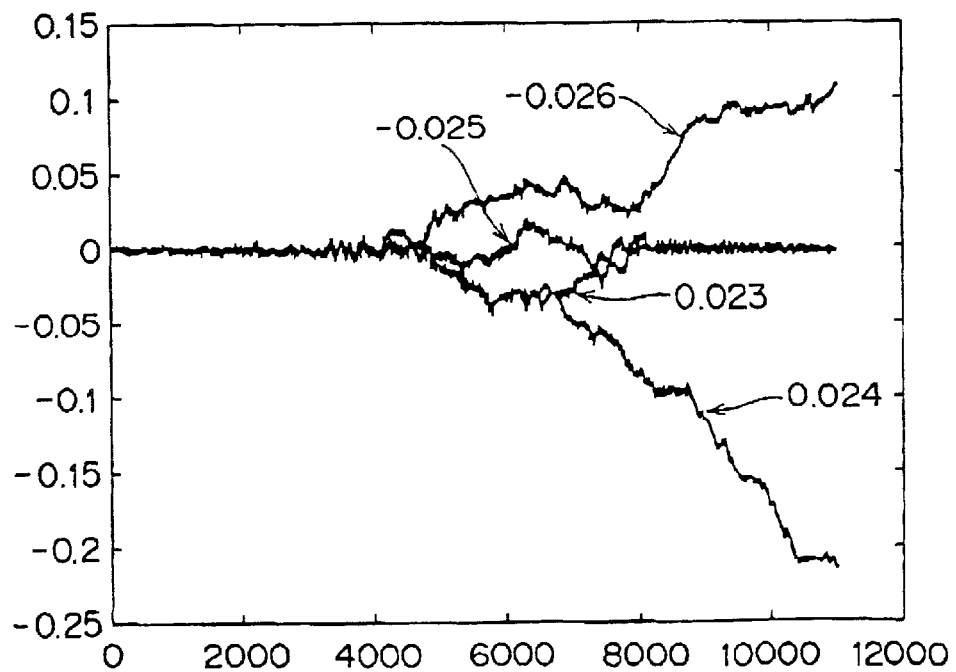

F I G. 10
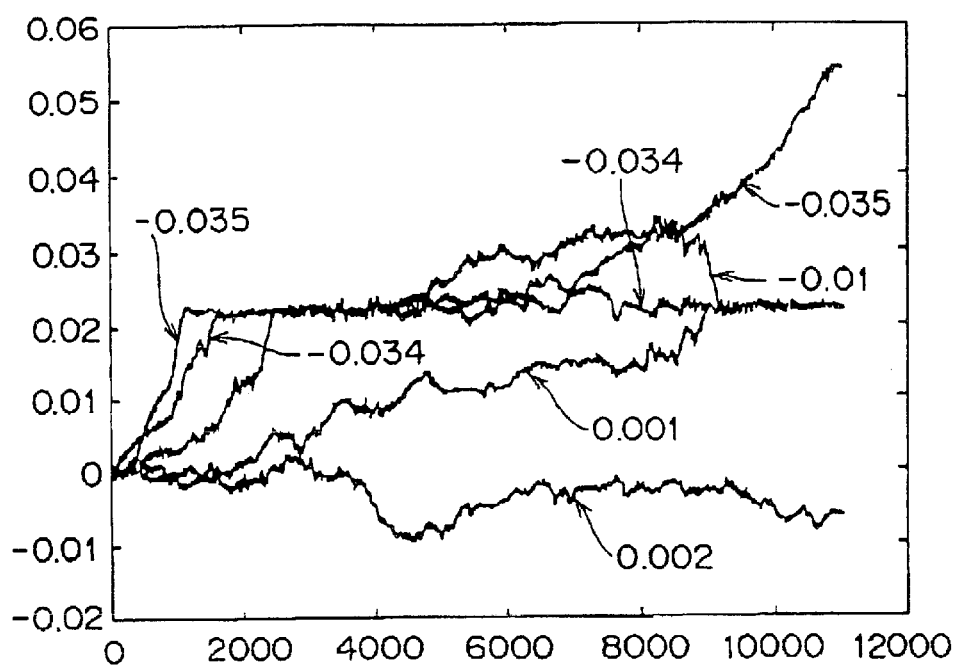
F I G. 11
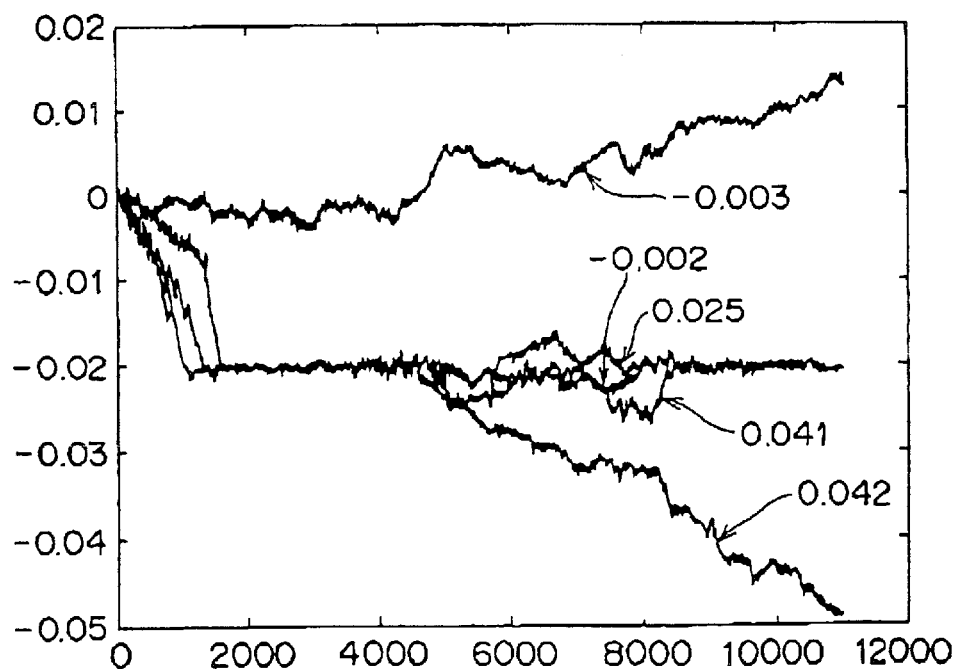

F I G. 12
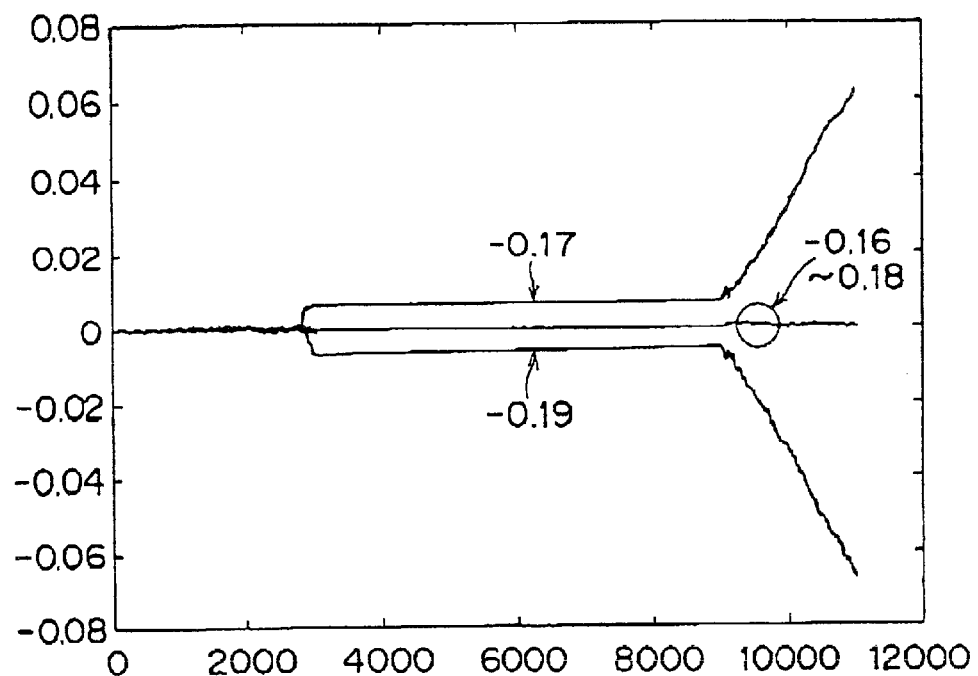
F I G. 13
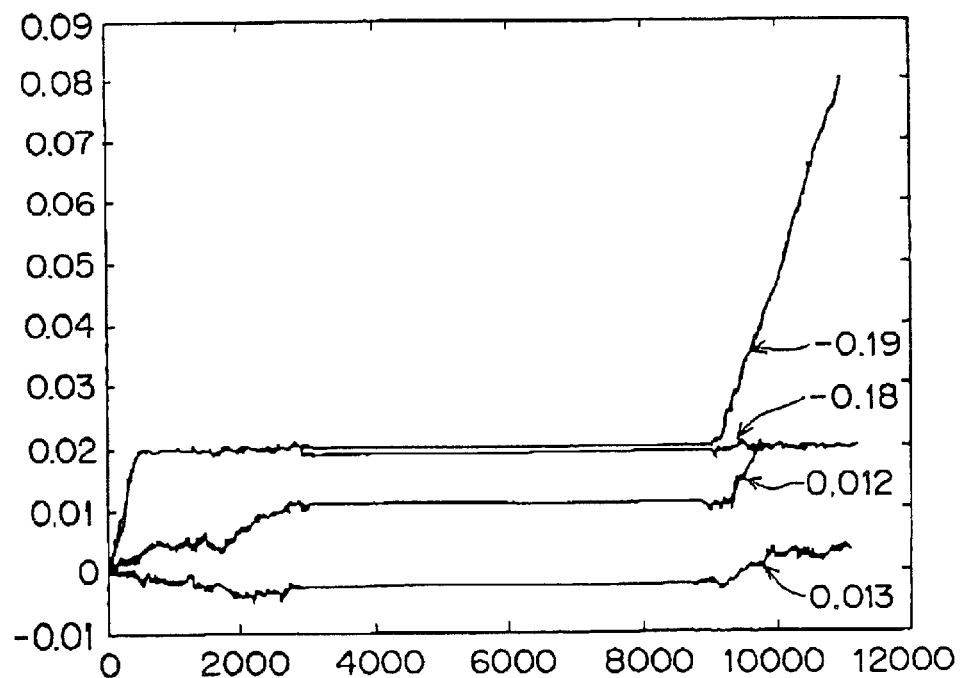

PLL CIRCUIT AND RECORDING AND PLAYBACK APPARATUS USING SAME

BACKGROUND OF THE INVENTION

The present invention relates to a PLL (Phase Locked Loop) circuit and a recording and playback apparatus using the same and, particularly, to a PLL circuit suitable for use as a clock recovery circuit of a recording and playback apparatus whose head crosses tracks during search and a recording and playback apparatus using the same as a clock recovery circuit.

A signal processing method referred to as PRML (Partial Response Maximum Likelihood) for a recording and playback apparatus, such as a tape streamer, a hard disk apparatus, and an optical disk apparatus, has recently been drawing attention. The PRML signal processing method is a technique that makes it possible to increase recording density by a factor of 1.2 to 1.5 by a signal processing without greatly changing an existing recording and playback system.

The description in the following will be made by taking a tape recording and playback apparatus employing a helical scanning method as an example of the recording and playback apparatus. When the tape recording and playback apparatus searches on an azimuth-recorded magnetic tape, as shown in FIG. 18, a trajectory of the head becomes inclined more than recording tracks do. A waveform (envelope) of a signal reproduced during the search is shaped like so-called abacus beads, which are rhombuses arranged in a row, as shown in FIG. 19.

When a search is made at a centuple speed, for example, the head crosses about 100 tracks. In the case of azimuth recording, a head cannot read a signal on an adjoining track, and therefore the waveform of the reproduced signal reaches its peak once every two tracks. As a matter of course, only a noise component is produced at a valley between two peaks. Also, even when a mechanical compensation is provided during the search, the frequency of data reading is usually changed slightly (about +/−2%).

FIG. 20 is a configuration block diagram of a clock recovery section used in a common PRML signal processing method. The clock recovery section has a configuration of a PLL circuit, comprising a phase comparator 101, a loop filter 102, and a VCO (voltage-controlled oscillator) 103. The phase comparator 101 comprises a sampling circuit 111, an arithmetic circuit 112, and a tentative determination device 113.

In ternary (1, 0, −1) data detection, an amplitude value of the data is converted into phase error information, as shown in FIG. 21. FIG. 21 shows a case where a clock is delayed. In FIG. 21, ○ denotes true data timing, and • denotes actual data timing.

In order to convert the amplitude value of the data into the phase error information, it is necessary to know whether the data detected is 1, 0, or −1. Therefore, the phase comparator 101 generally uses the tentative determination device 113. The tentative determination device 113 provides a result of tentative determination of 1, 0, or −1 by comparing the data with two threshold levels TH and TL.

In the case of FIG. 21, the result of tentative determination is changed in a sequence of 0, 1, 0, and −1 at times a to d. Therefore, data at the time a is reversed and data at the time c can be used as it is as phase error information. When letting St be a sample value (t is a clock #), Dt be a tentative determination value, and Pt be a phase output, the arithmetic equation is expressed as follows:

$$Pt = St \text{ if } Dt=0 \text{ and } Dt+1=1$$

$$Pt = St \text{ if } Dt=0 \text{ and } Dt+1=-1$$

There are various partial response methods, and there are various data processing methods other than that shown in FIG. 21, in which phase error information is outputted only when the tentative determination value is zero. The arithmetic method of the arithmetic circuit 112 differs accordingly, but the fundamental concept is the same. Although data obtained after Viterbi decoding may be used instead of employing the tentative determination device 113, this enlarges the loop and results in higher susceptibility to delay.

PLL behavior under such conditions will be analyzed. In this case, it is supposed that sampling timing of the tentative determination device 113 and timing of the data are different from each other. Such difference in timing seems unnatural; however, in the case of an actual circuit, even at for example 100 Mbits/sec, a value very commonly observed with a current technique, the bit width is 10 nsec and 1% of that is 100 ps.

A delay on the order of this value can occur as a clock skew between latches of a flash A/D converter, for example. When the delay is to be handled in an analog fashion, a tentative determination comparator and a sampling comparator are often provided separately. Thus, a sampling timing difference (delay) of 1 or 2% of a 1-bit width greatly affects the PLL behavior.

The results of analysis are summarized as follows.

(1) When a waveform obtained during a search is made substantially flat by being passed through an AGC (Automatic Gain Control) circuit, the PLL is disturbed due to the effects of noise occurring during track crossing. The noise effects depend heavily on the above-mentioned error in timing between the data and the tentative determination device 113, and the tolerance for the error is about +/−2%.

(2) When there is a difference between an oscillating frequency of the VCO 103 and a data rate, the tolerance is further reduced to about half that of (1). In addition, a range of tolerable delay differs according to whether the frequency is high or low.

Thus, unless the delay between the data sample and the tentative determination device 113 is precisely controlled to be infinitely close to zero, a stable search cannot be made, and thus substantially no design margin is allowed.

The reason why such a problem arises is as follows. The PLL behavior is disturbed by noise, and when there is a frequency deviation, the PLL behaves to eliminate the difference. In the former case, a smaller loop gain (lower natural frequency ωn) is advantageous, whereas in the latter case, a larger loop gain (higher natural frequency ωn) is advantageous. Thus, it is difficult to make a setting at a point of compromise between these values.

SUMMARY OF THE INVENTION

The present invention has been made in view of the above problems, and it is accordingly an object of the present invention to provide a PLL circuit and a recording and playback apparatus using the same that can stabilize the search operation and increase the design margin by preventing the PLL behavior from being disturbed by noise.

A PLL circuit according to the present invention includes: a loop circuit section including a phase comparator, a loop filter, and a voltage controlled oscillator for generating a clock on the basis of an input signal; and control means for determining that the level of the input signal is at or lower than a specified level and then holding PLL operation of the loop circuit section on the basis of the result of the determination. The PLL circuit is used in a recording and playback apparatus as a clock recovery circuit that generates, on the basis of the signal read from a recording medium, a sampling clock for an A/D converter for subjecting the signal to A/D conversion.

When the PLL circuit thus comprised and the recording and playback apparatus using the same as a clock recovery circuit detect that the level of the signal read from a recording medium is at or lower than a certain level during track crossing for a search, the PLL circuit and the recording and playback apparatus hold the PLL operation. Therefore, the PLL behavior is not disturbed by a noise component occurring during track crossing. Thus, it is possible to stabilize the search operation and substantially increase the design margin.

Another PLL circuit according to the present invention includes: a loop circuit section including a phase comparator, a loop filter, and a voltage controlled oscillator for generating a clock on the basis of an input signal, the PLL circuit supplying the clock generated by the loop circuit section to an A/D converter for subjecting the input signal to A/D conversion; first delay means for delaying the generated clock and then supplying the clock to the A/D converter; and second delay means for delaying the generated clock and then supplying the clock to the phase comparator.

It is preferable to provide a relative delay between the clock supplied to the A/D converter through the first delay means and the clock supplied to the phase comparator through the second delay means. The PLL circuit is used in a recording and playback apparatus as a clock recovery circuit that generates, on the basis of the signal read from a recording medium, the sampling clock for the A/D converter for subjecting the signal to A/D conversion.

The PLL circuit thus comprised and the recording and playback apparatus using the same as a clock recovery circuit provide a relative delay between the clock supplied to the phase comparator and the clock supplied to the A/D converter, whereby there are greatly increased chances of the phase comparator determining phase delay, for example. Therefore, the PLL behaves actively to advance the phase when the phase is delayed. As a result, the PLL quickly makes a transition to a phase-locked state. Thus, it is possible to realize a more stable search operation and substantially increase the design margin.

BRIEF DESCRIPTION OF THE DRAWINGS

FIG. 1 is a block diagram showing a configuration of a digital tape recording and playback apparatus that employs a common PRML method and to which the present invention is applied;

FIG. 2 is a block diagram showing a configuration of a PLL circuit according to a first embodiment of the present invention;

FIG. 5 is a block diagram showing a configuration of a PLL circuit according to a third embodiment of the present invention;

FIG. 8 is a characteristic diagram (2) showing results of simulation;

FIG. 9 is a characteristic diagram (3) showing results of simulation;

FIG. 10 is a characteristic diagram (4) showing results of simulation;

FIG. 11 is a characteristic diagram (5) showing results of simulation;

FIG. 12 is a characteristic diagram (6) showing results of simulation;

FIG. 13 is a characteristic diagram (7) showing results of simulation;

DETAILED DESCRIPTION OF PREFERRED EMBODIMENTS

Figures 3A, 3B:
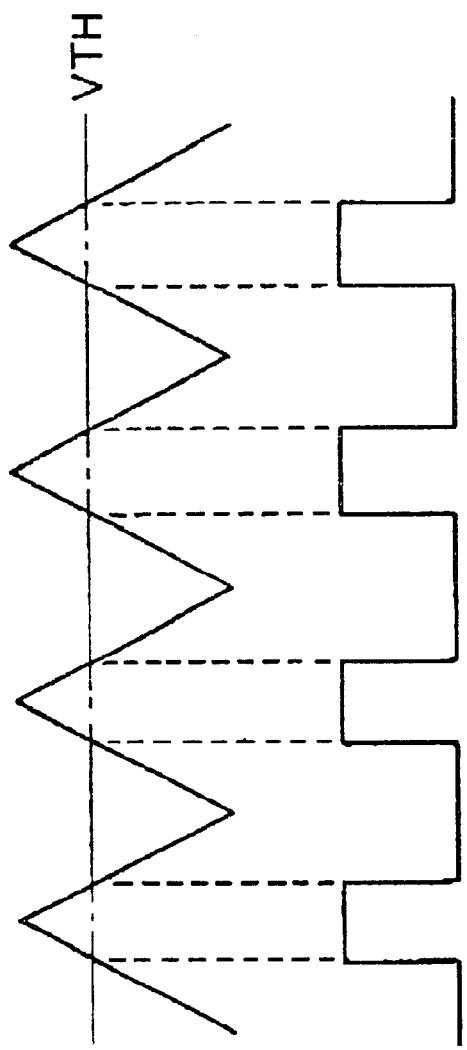
FIGS. 3A and 3B show waveforms of parts of a level-determining circuit in the PLL circuit according to the first embodiment.

Preferred embodiments of the present invention will hereinafter be described in detail with reference to the drawings. FIG. 1 is a block diagram showing a configuration of a digital tape recording and playback apparatus that employs the common PRML method and to which the present invention is applied.

In FIG. 1, information recorded on a magnetic tape 11 serving as a recording medium is read by a magnetic head 12 serving as a reading means. Playback output from the magnetic head 12 is passed through a preamplifier 13, then controlled in gain by an AGC circuit 14, and further subjected to frequency compensation by an analog equalizer (EQ) 15. Thereafter, the playback output is fed back to the AGC circuit 14 and is also supplied to an A/D converter 16 and a clock recovery circuit 17.

On the basis of the playback output that has passed through the analog equalizer 15, the clock recovery circuit 17 generates a clock in synchronism with the playback output. The clock generated in the clock recovery circuit 17 is supplied to the A/D converter 16 as a sampling clock. Playback data digitalized by the A/D converter 16 is passed through a digital equalizer 18, then subjected to Viterbi decoding by a Viterbi decoder 19, and further demodulated by a demodulator circuit 20 that includes an ECC (error correcting circuit).

On the other hand, in a recording system (writing system), data (digital input sequence) are modulated by a modulator circuit 21 that includes an ECC and then supplied to the magnetic head 12 through a writing compensation circuit 22 and a writing amplifier 23. Then, the magnetic head 12 writes the data on the magnetic tape 11.

The clock recovery circuit 17 in the tape recording and playback apparatus thus formed employs a PLL circuit configuration. The present invention is characterized by the concrete configuration of a PLL circuit used as the clock recovery circuit 17. Concrete embodiments of the PLL circuit will be described below.

[First Embodiment]

FIG. 2 is a block diagram showing a configuration of a PLL circuit according to a first embodiment of the present invention.

Figure 20:
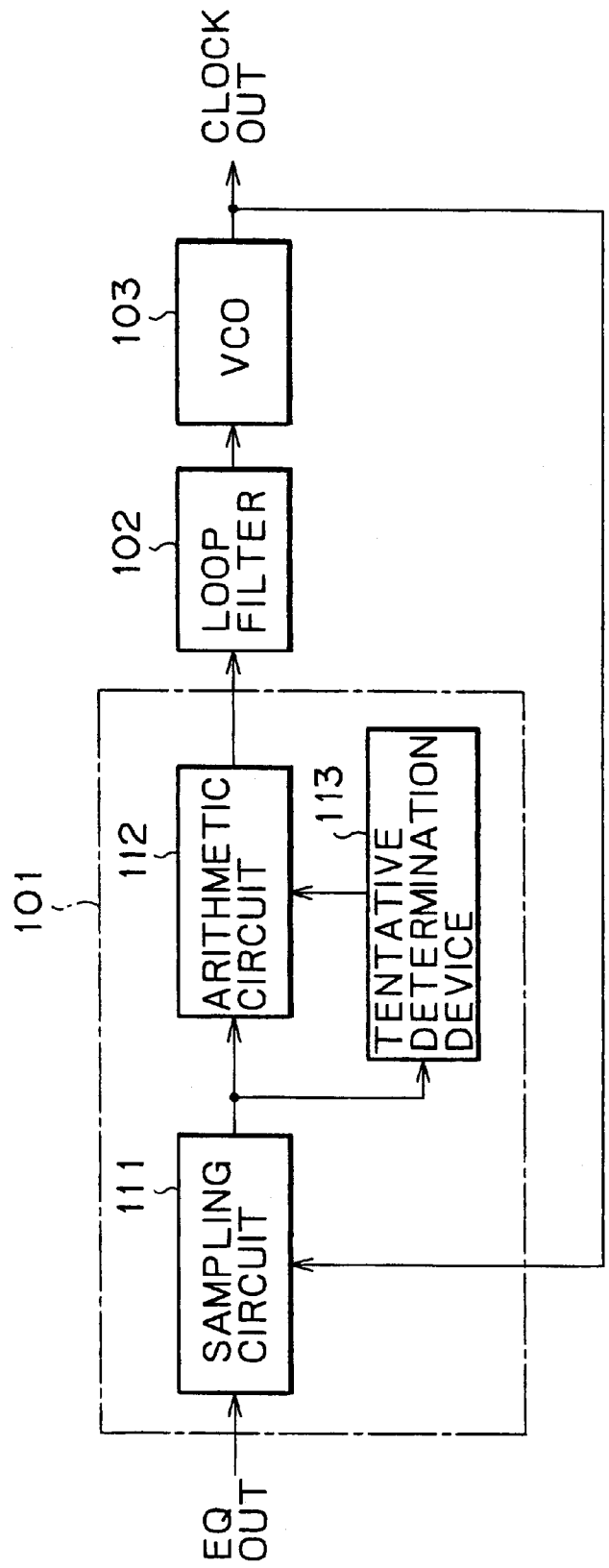
FIG. 20 is a configuration block diagram of a clock recovery section used in a common PRML signal processing method.
Figure 21:
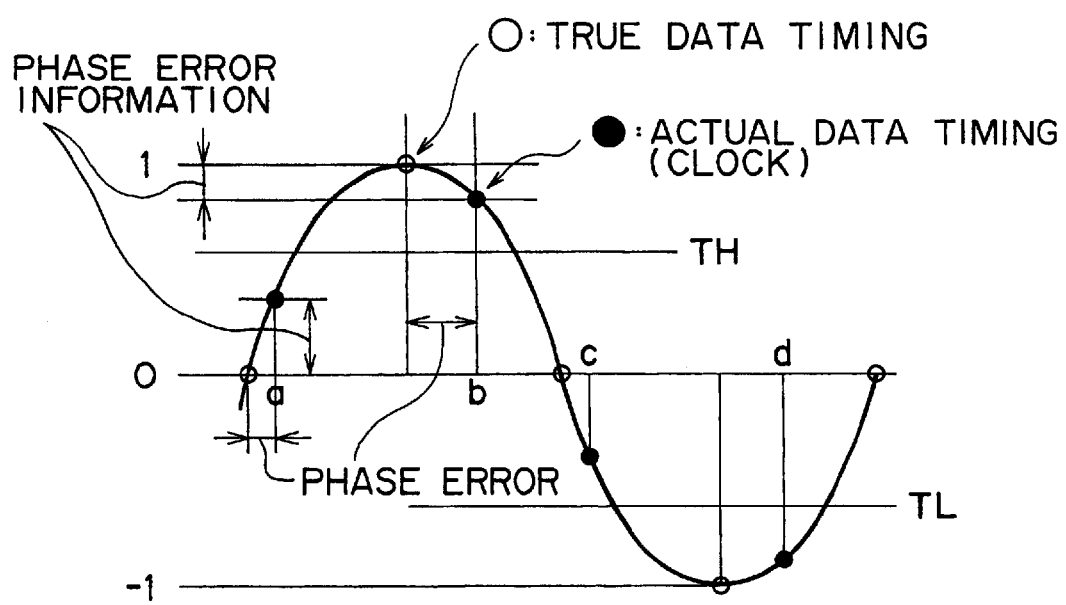
FIG. 21 is a waveform diagram of assistance in briefly explaining operating principles of the clock recovery section.

The PLL circuit 30 according to the first embodiment has, as its fundamental circuit, a circuit section (loop circuit section) comprising a phase comparator (PD) 31, a loop filter 32, and a VCO (voltage controlled oscillator) 33, and additionally has a level determining circuit 34. The phase comparator 31 has, for example, a configuration as shown in FIG. 20, that is, a configuration formed by a sampling circuit, an arithmetic circuit, and a tentative determination device.

The level-determining circuit 34 comprises a full-wave rectifier 35, a low-pass filter (LPF) 36, a peak detector 37, a comparator 38 and the like. The level-determining circuit 34 has a function as a control means for detecting the level of head output that has passed through the preamplifier 13 (see FIG. 1) and holding the PLL operation when the level of the head output becomes an appropriate threshold level or lower.

Figure 19:
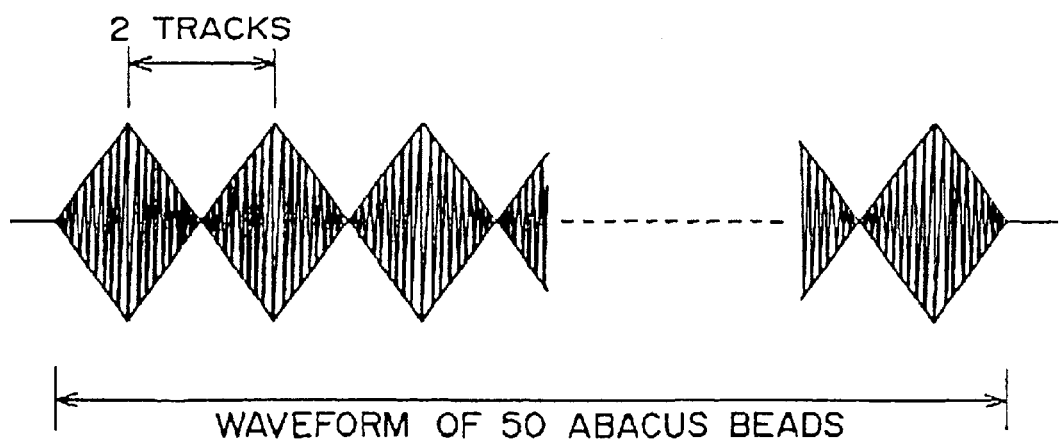
FIG. 19 is a waveform diagram showing a waveform of a signal reproduced during a search.

The full-wave rectifier 35 subjects the head output that has passed through the preamplifier 13 to full-wave rectification. The low-pass filter 36 extracts a low-frequency component of the head output that has been subjected to full-wave rectification by the full-wave rectifier 35. When a high-speed search is made on an azimuth-recorded magnetic tape, the head output during the high-speed search has a waveform shaped like abacus beads (see FIG. 19). Accordingly, the low-pass filter 36 outputs a sawtooth wave, as shown in FIG. 3A.

The head output (A) having the sawtooth waveform is supplied to the peak detector 37 and the comparator 38. The peak detector 37 detects a peak of the head output (A) having the sawtooth waveform. Voltage of the peak-detected output is divided by resistances R11 and R12 with an appropriate resistance ratio. The divided voltage level is supplied to the comparator 38 as a threshold level VTH of the comparator 38.

The comparator 38 outputs, as a result of comparison, a high level (B) when the head output (A) having the sawtooth waveform is higher than the threshold level VTH and a low level (B) when the head output (A) having the sawtooth waveform is at or lower than the threshold level VTH. The low-level comparison output (B) serves as a signal for effecting a hold on the loop filter 32.

The level-determining circuit 34 thus configured provides the low-level comparison output (B) when the level of the head output (A) in the form of abacus beads becomes a certain level (threshold level VTH) or lower during the high-speed search. The loop filter 32 is brought into a hold state by supplying the low-level comparison output (B) to the loop filter 32 in the PLL circuit.

The loop filter is formed generally by a charge pump circuit and a C (capacitor) R (resistance) circuit. The loop filter 32 thus formed can be brought into a hold state easily by configuring the loop filter 32 so as to keep the output impedance of the charge pump circuit high while the comparison output (B) of the level determining circuit 34 is at the low level. Thus, a voltage for controlling the VCO 33 is held in the immediately preceding stage, and the PLL operation can be held as a result.

As described above, in the digital tape recording and playback apparatus employing the PRML method, the PLL circuit 30 according to the first embodiment detects that the head output level (signal level) is at or lower than a certain level during track crossing for a high-speed search, and thereby holds the PLL operation. Therefore, PLL behavior is not disturbed by noise occurring during track crossing. Thus, it is possible to greatly improve the tolerance for relative delay between clocks of the tentative determination device in the phase comparator 31 and the A/D converter 16.

[Second Embodiment]

Figure 4:
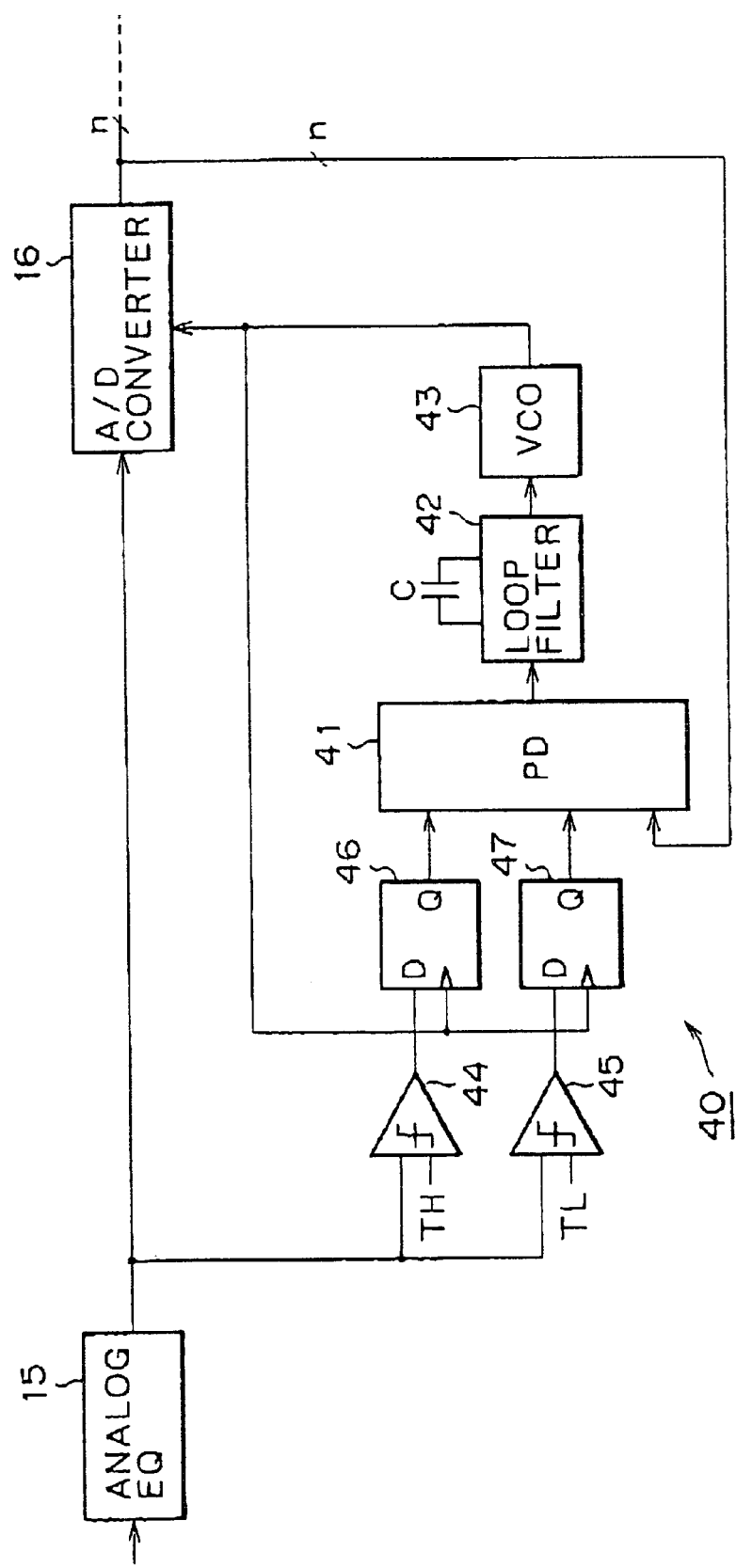
FIG. 4 is a block diagram showing a configuration of a PLL circuit according to a second embodiment of the present invention.

FIG. 4 is a block diagram showing a configuration of a PLL circuit according to a second embodiment of the present invention.

The PLL circuit 40 according to the second embodiment has, as its fundamental circuit, a circuit section (loop circuit section) comprising a phase comparator 41, a loop filter 42, and a VCO 43, and additionally has two comparators 44 and 45 and two D-FFs (flip-flops) 46 and 47. In this case, output data of the A/D converter 16 are inputted to the phase comparator 41.

The two comparators 44 and 45 have fixed threshold levels TH and TL, respectively, as comparison reference levels, and compare the head output that has passed through the analog equalizer 15 with the comparison reference levels. Thus, the comparators 44 and 45 are configured as the foregoing tentative determination device. Comparison outputs of the comparators 44 and 45 are latched by the two D-FFs 46 and 47, respectively, in synchronism with a clock supplied from the VCO 43.

The phase comparator 41 in the PLL circuit 40 thus formed detects a data transition, for example, from 0 to 1 from the output sequence of the tentative determination device, that is, the comparators 44 and 45, to thereby know the presence of phase information therein. By allowing a result of the detection to remain zero while the level of the head output is lowered, it is possible to detect that the head output is at or lower than a certain level during a high-speed search.

This may be realized by, for example, fixing the threshold levels TH and TL of the comparators 44 and 45. In this case, or during the search, at least a time constant of the AGC circuit 14 (see FIG. 1) is set large so that the abacus-bead waveform is retained as it is. Thus, the tentative determination device comprising the comparators 44 and 45 and the D-FFs 46 and 47 functions as a control means for holding the PLL operation when an absolute value of the head output level becomes the threshold levels TH and TL or lower.

As described above, in the digital tape recording and playback apparatus employing the PRML method, the phase comparator 41 of the PLL circuit 40 according to the second embodiment does not output phase information when the absolute value of the head output is at or lower than the upper and lower threshold levels TH and TL during track crossing for a high-speed search, and thereby the PLL circuit 40 automatically holds the PLL operation. Therefore, as in the case of the PLL circuit 30 according to the first embodiment, the PLL behavior is not disturbed by noise occurring during track crossing. Thus, it is possible to greatly improve the tolerance for relative delay between clocks of the A/D converter 16 and the tentative determination device comprising the comparators 44 and 45 and the D-FFs 46 and 47.

It is to be noted that the second embodiment has been described by taking as an example a case in which the output data of the A/D converter 16 are used as the data inputted to the phase comparator 41; however, the embodiment is not limited to this method. Of course, any other method, such as an analog sample hold, may be used.

[Third Embodiment]

FIG. 5 is a block diagram showing a configuration of a PLL circuit according to a third embodiment of the present invention.

The PLL circuit 50 according to the third embodiment has, as its fundamental circuit, a circuit section (loop circuit section) comprising a phase comparator 51, a loop filter 52, and a VCO 53, and additionally has two comparators 54 and 55, two D-FFs 56 and 57, and two delay circuits 58 and 59. In this case, the output data of the A/D converter 16 are used as data inputted to the phase comparator 51. However, as in the case of the second embodiment, the third embodiment is not limited to this method.

The two comparators 54 and 55 have fixed threshold levels TH and TL, respectively, as comparison reference levels, and compare the head output that has passed through the analog equalizer 15 with the comparison reference levels. Comparison outputs of the comparators 54 and 55 are latched by the two D-FFs 56 and 57, respectively, in synchronism with a clock supplied from the VCO 53 via the delay circuit 59.

Of the two delay circuits 58 and 59, one delay circuit 58 delays the oscillating clock of the VCO 53 by a first delay time and supplies the oscillating clock to the A/D converter 16 as its sampling clock. The other delay circuit 59 delays the oscillating clock of the VCO 53 by a second delay time and supplies the oscillating clock to the D-FFs 56 and 57 as their clock input.

By fixing the threshold levels TH and TL of the tentative determination comparators 54 and 55 in the PLL circuit 50 thus formed, it is possible for the phase comparator 51 to detect that the head output level is at or lower than a certain level during a high-speed search. In this case (during the search), at least the time constant of the AGC circuit 14 is set large so that the abacus-bead waveform is retained as it is.

Thus, as in the PLL circuit 40 according to the second embodiment, the phase comparator 51 does not output phase error information when the absolute value of the head output level (signal level) is at or lower than the upper and lower threshold levels TH and TL during track crossing for the high-speed search, and thereby the PLL circuit 50 automatically holds the PLL operation. Thus, it is possible to improve greatly the tolerance for relative delay between the clocks of the A/D converter 16 and the tentative determination device comprising the comparators 54 and 55 and the D-FFs 56 and 57.

The PLL circuit 50 according to the third embodiment is suitable for use in a case where a frequency deviation occurs in the head output during a search. When a frequency deviation occurs, the tolerable delay range is changed depending on whether the frequency of the head output is higher or lower than the oscillating frequency of the VCO 53.

This is positively taken advantage of by the PLL circuit 50 according to the third embodiment: the programmable delay circuits 58 and 59 are provided in advance in the PLL circuit 50 to provide a relative delay between the sampling timing of the tentative determination device comprising the comparators 54 and 55 and the D-FFs 56 and 57 and the sampling timing of the A/D converter 16. Thus, a more stable search is realized.

More specifically, when the signal frequency (head output frequency) is lower than the oscillating frequency of the VCO 53, the clock of the D-FFs 56 and 57 latching the comparison outputs of the tentative determination comparators 54 and 55 is advanced with respect to the sampling clock of the A/D converter 16. As an example, the delay of the delay circuit 58 may be set at zero, and the delay of the delay circuit 59 may be set at two percent to several percent of a 1-bit time interval.

Figure 6:
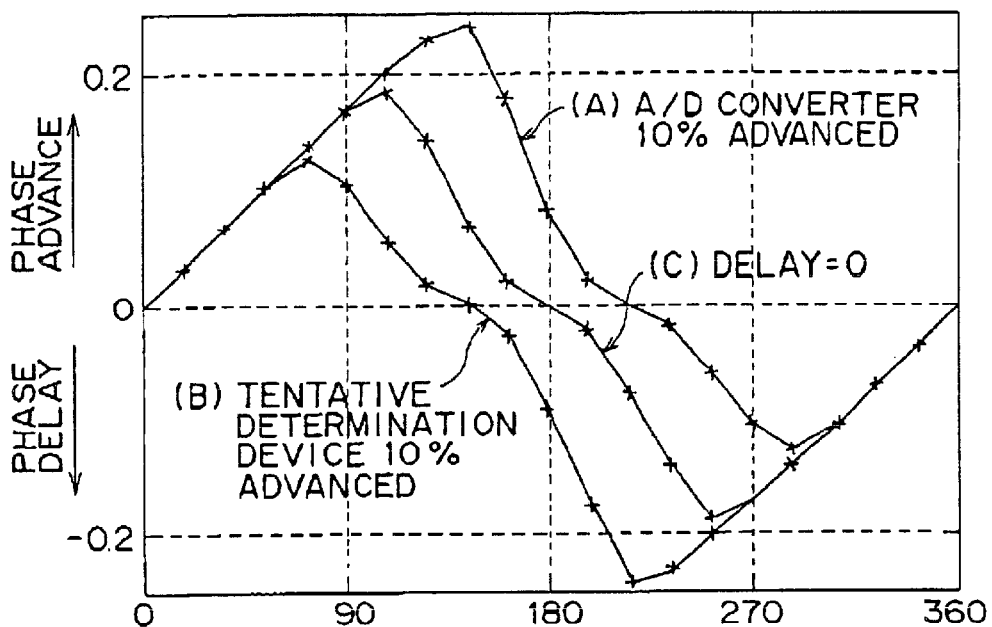
FIG. 6 shows input-output characteristics of a phase comparator in the PLL circuit according to the third embodiment.

FIG. 6 shows input-output characteristics of the phase comparator 51. In the characteristics diagram of FIG. 6, (A) indicates that the sampling timing of the A/D converter 16 is advanced by 10% with respect to that of the tentative determination device; (B) indicates that the sampling timing of the tentative determination device is advanced by 10% with respect to that of the A/D converter 16; and (C) indicates that the relative delay between the two is zero.

As is clear from the input-output characteristics diagram, by providing a relative delay between the sampling timing of the tentative determination device and the sampling timing of the A/D converter 16, there are greatly increased chances of the phase comparator 51 determining a phase advance or a phase delay. In other words, the PLL behaves actively to advance the phase when the phase is delayed. Thus, the PLL quickly makes a transition to a phase-locked state, and therefore even when a frequency deviation occurs in the head output during a search, a more stable search operation can be realized.

It is to be noted that while in the third embodiment the sampling clock of the A/D converter 16 is delayed, it is possible to delay the output signal of the analog equalizer 15 itself. In general, however, it is easier to delay the sampling clock of the A/D converter 16. Thus, by delaying the clock of the A/D converter 16, for example, the output of the tentative determination device is relatively delayed.

It is also to be noted that in the third embodiment, the time constant of the AGC circuit 14 is set large so that the abacus-bead waveform is retained as it is during the search, and thereby the PLL operation is held; however, the third embodiment is not limited to this configuration. When the time constant of the AGC circuit 14 is set small and the response speed of the AGC is increased, for example, the configuration of the PLL circuit 30 according to the first embodiment (see FIG. 2) may be used in conjunction with the third embodiment.

However, the configurations (for holding the PLL) according to the first and second embodiments do not necessarily need to be used in conjunction with the third embodiment. Only by providing the programmable delay circuits 58 and 59 to provide a relative delay between the sampling timing of the tentative determination device comprising the comparators 54 and 55 and the D-FFs 56 and 57 and the sampling timing of the A/D converter 16, it is possible to obtain the effect of realizing a more stable search even when a frequency deviation occurs in the head output during the search.

However, the use of the third embodiment in conjunction with the configurations according to the first and second embodiments can extend the tolerance for relative delay between the sampling timing of the tentative determination device and the sampling timing of the A/D converter 16. This increases the degree of freedom of delay setting and the design margin, thus providing greater effects.

The results of simulations using the PLL circuit 50 according to the third embodiment as an example will be shown in the following. FIGS. 7 to 16 are characteristic diagrams showing the results of simulations performed under different set conditions. In the characteristic diagrams, the axis of abscissa represents the frequency, whereas the axis of ordinate represents the output voltage of the loop filter 52, that is, the input control voltage of the VCO 53. Numerical values in the characteristic diagrams represent the difference of the delay time of the delay circuit 59 from the delay time of the delay circuit 58.

Figure 7:
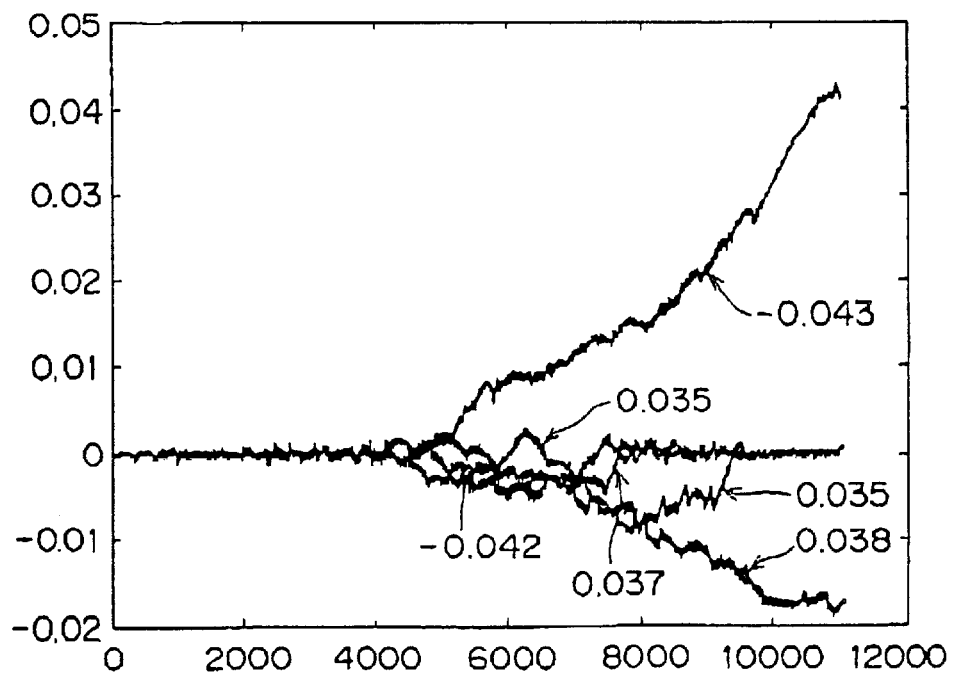
FIG. 7 is a characteristic diagram (1) showing results of simulation.

FIG. 7 shows the characteristics under the conditions of an on state of the AGC circuit 14 (hereinafter referred to simply as AGC on), no frequency offset, $\omega n$ (natural frequency)=0.02, and noise: white noise (non-correlation noise).

FIG. 8 shows the characteristics under the conditions of AGC on, no frequency offset, $\omega n$=0.02, and noise: 1+D. In this case, 1+D represents the results of addition of the white noise to a noise obtained by delaying the white noise by an amount corresponding to one clock, it being assumed that the white noise is 1.

FIG. 9 shows the characteristics under the conditions of AGC on, no frequency offset, $\omega n$=0.05, and noise: 1+D.

FIG. 10 shows the characteristics under the conditions of AGC on, frequency offset=0.002, $\omega n$=0.02, and noise: 1+D.

FIG. 11 shows the characteristics under the conditions of AGC on, frequency offset=−0.02, $\omega n$=0.02, and noise: 1+D.

FIG. 12 shows the characteristics under the conditions of AGC & PLL hold during a period of signal level<0.5, no frequency offset, $\omega n$=0.02, and noise: 1+D.

FIG. 13 shows the characteristics under the conditions of AGC & PLL hold during the period of signal level<0.5, frequency offset=0.02, $\omega n$=0.02, and noise: 1+D.

Figure 14:
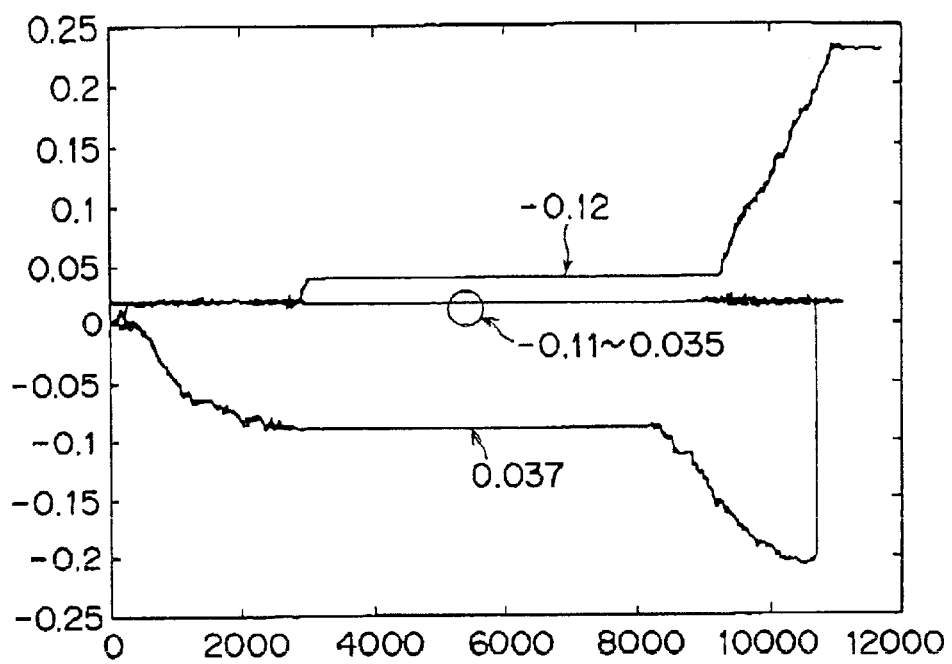
FIG. 14 is a characteristic diagram (8) showing results of simulation.

FIG. 14 shows the characteristics under the conditions of AGC & PLL hold during the period of signal level<0.5, frequency offset=0.02, $\omega n$=0.05, and noise: 1+D.

Figure 15:
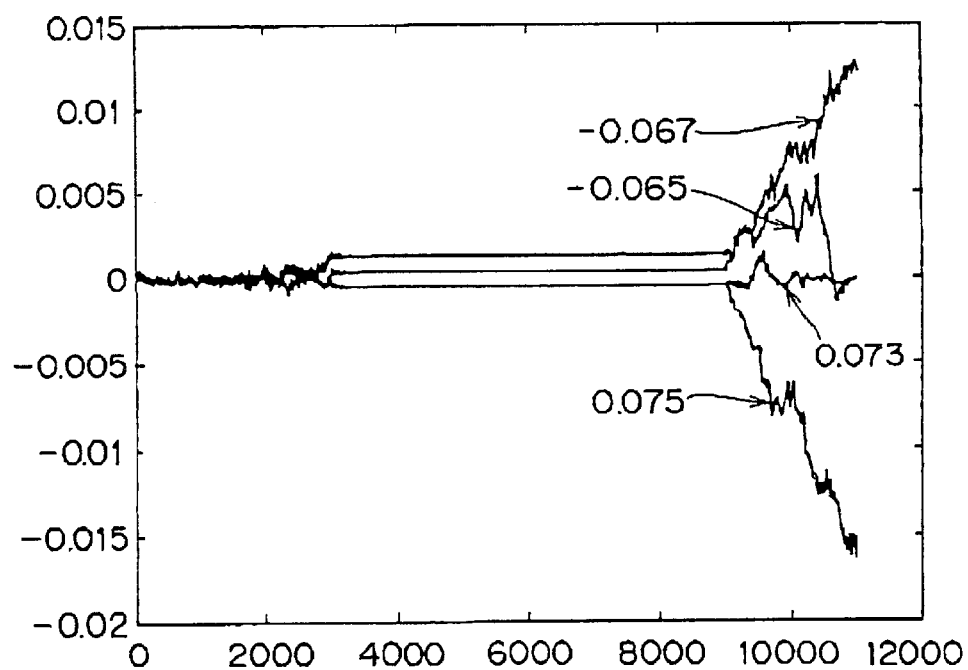
FIG. 15 is a characteristic diagram (9) showing results of simulation.

FIG. 15 shows the characteristics under the conditions of no AGC and PLL hold, no frequency offset, $\omega n$=0.02, and noise: 1+D.

Figure 16:
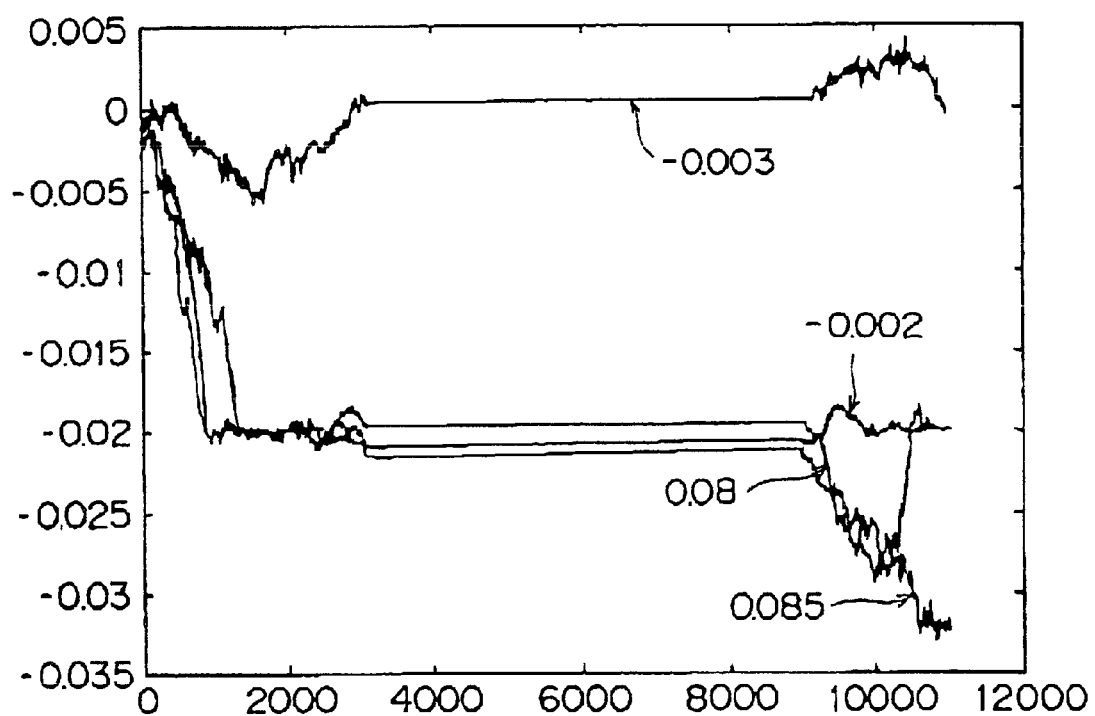
FIG. 16 is a characteristic diagram (10) showing results of simulation.

FIG. 16 shows the characteristics under the conditions of no AGC and PLL hold, frequency offset=−0.02, $\omega n$=0.02, and noise: 1+D.

Figure 17:
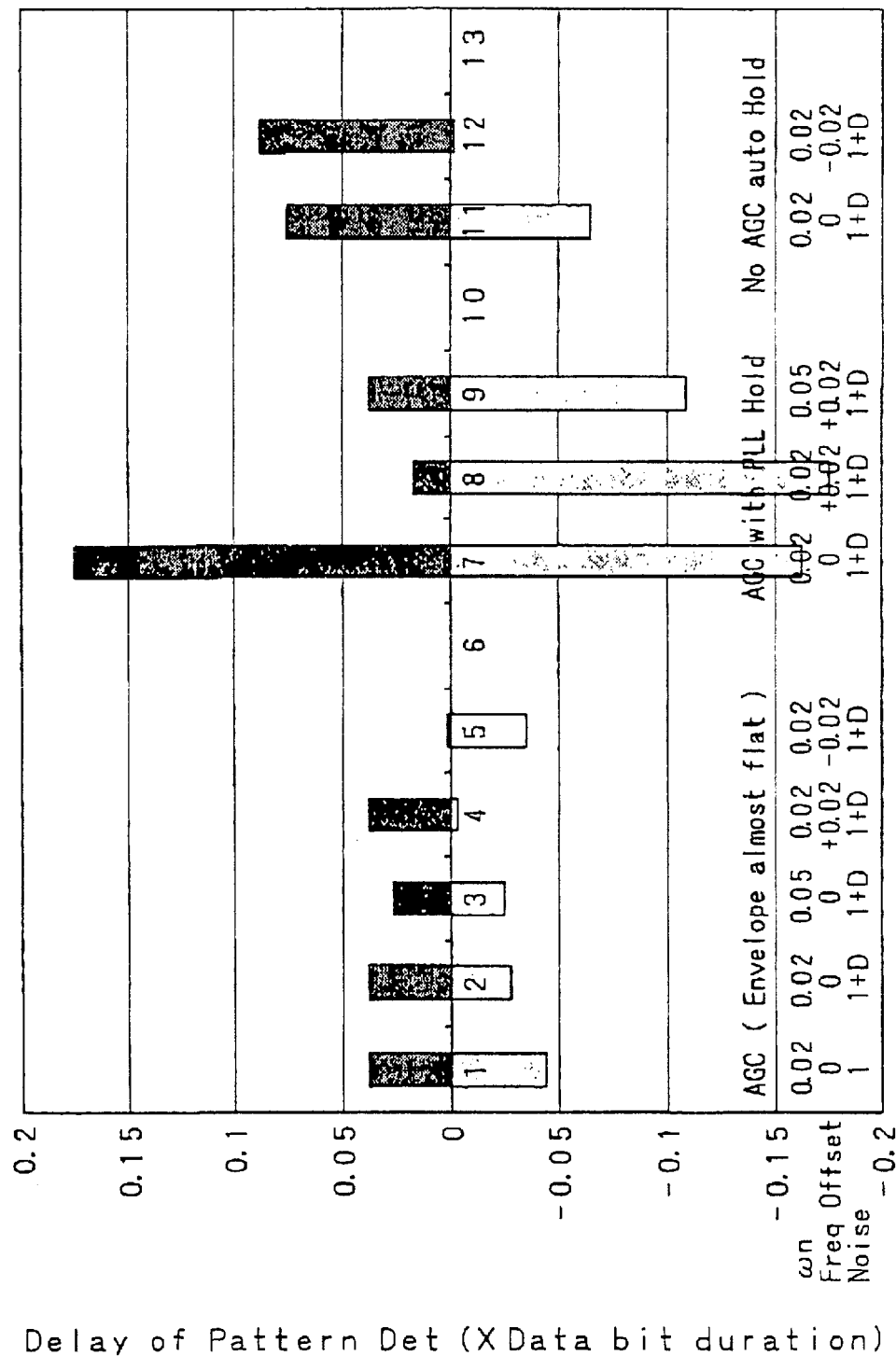
FIG. 17 shows a tolerance for relative delay for different set conditions based on the results of simulation.
Figure 18:
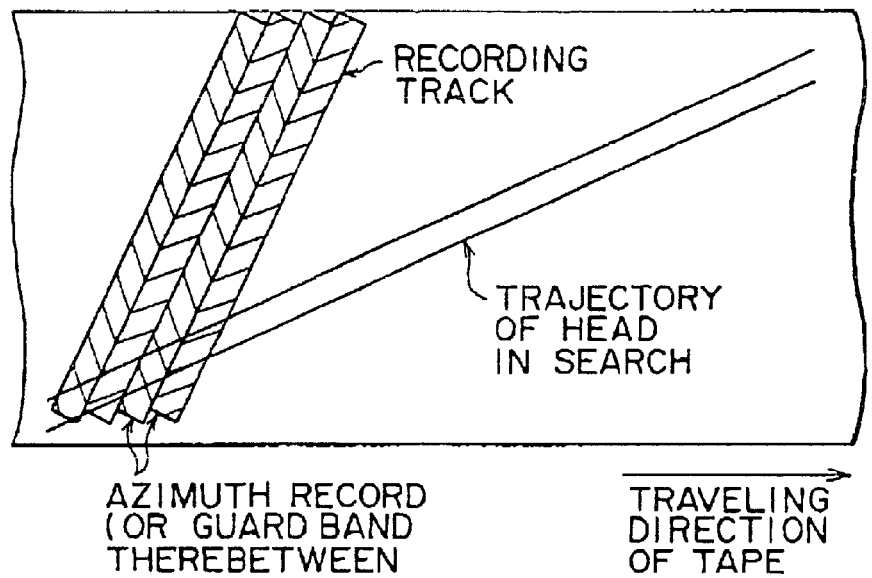
FIG. 18 shows a head trajectory on a recording track during the search of an azimuth-recorded magnetic tape.

FIG. 17 shows the tolerance for relative delay (between the sampling timing of the tentative determination device and the sampling timing of the A/D converter 16) for the different set conditions based on the results of simulation.

As is clear from the characteristic diagram of FIG. 17, in the digital tape recording and playback apparatus employing the PRML method, the holding of the PLL operation extends the tolerance for relative delay where noise is frequently produced, as in track crossing for a high-speed search. It is also clear from FIG. 17 that the direction of the tolerable delay is reversed depending on whether the sampling timing of the A/D converter 16 is advanced or the sampling timing of the tentative determination device is advanced.

It is to be noted that the above description has been made by taking the cases where the PLL circuits 30, 40, and 50 according to the first, second, and third embodiments are used as a clock recovery circuit in the digital tape recording and playback apparatus, such as a tape streamer; however, the present invention is not limited to these application examples. The present invention is similarly applicable to a recording and playback apparatus (or playback apparatus), such as an optical disk apparatus, whose head (optical pickup) performs the operation of crossing tracks during a search.

While a preferred embodiment of the invention has been described using specific terms, such description is for illustrative purpose only, and it is to be understood that changes and variations may be made without departing from the spirit or scope of the following.

What is claimed is:

1. A PLL circuit comprising:
   a loop circuit section including a phase comparator, a loop filter, and a voltage controlled oscillator for generating a clock on the basis of an input signal, the clock generated by the loop circuit section being supplied to an A/D converter for subjecting said input signal to A/D conversion;
   first delay means for delaying the clock generated by said loop circuit section and then supplying the clock to said A/D converter; and
   second delay means for delaying the clock generated by said loop circuit section and then supplying the clock to said phase comparator.

2. A PLL circuit as claimed in claim 1,
   wherein a relative delay is provided between the clock supplied to said A/D converter through said first delay means and the clock supplied to said phase comparator through said second delay means.

3. A PLL circuit comprising:
   a loop circuit section including a phase comparator, a loop filter, and a voltage controlled oscillator for generating a clock on the basis of an input signal, the clock generated by the loop circuit section being supplied to an A/D converter for subjecting said input signal to A/D conversion;
   control means for holding a PLL operation of said loop circuit section when a level of said input signal is at or lower than a specified level;
   first delay means for delaying the clock generated by said loop circuit section and then supplying the clock to said A/D converter; and
   second delay means for delaying the clock generated by said loop circuit section and then supplying the clock to said phase comparator.

4. A PLL circuit as claimed in claim 3,
   wherein a relative delay is provided between the clock supplied to said A/D converter through said first delay means and the clock supplied to said phase comparator through said second delay means.

5. A recording and playback apparatus comprising:
   reading means for reading recorded information from a recording medium;
   an A/D converter for subjecting an output signal of said reading means to A/D conversion; and
   a PLL circuit having a loop circuit section including a phase comparator, a loop filter, and a voltage controlled oscillator for generating a clock on the basis of the output signal of said reading means, the clock generated by the loop circuit section being supplied to said A/D converter as a sampling clock therefor;
   wherein said PLL circuit has control means for determining if a level of the output signal of said reading means is at or lower than a specified level during a search and then holding a PLL operation of said loop circuit section on the basis of a result of the determination.

6. A recording and playback apparatus as claimed in claim 5,
   wherein said control means effects a hold on said loop filter when the level of the output signal of said reading means is at or lower than the specified level.

7. A recording and playback apparatus as claimed in claim 5,
   wherein the phase comparator of said PLL circuit detects data transition and thereby outputs phase information; and said control means sets a result of the detection by said phase comparator to zero when the level of the output signal of said reading means is at or lower than the specified level.

8. A recording and playback apparatus comprising:

reading means for reading recorded information from a recording medium;

an A/D converter for subjecting an output signal of said reading means to A/D conversion; and a PLL circuit having a loop circuit section including a phase comparator, a loop filter, and a voltage controlled oscillator for generating a clock on the basis of the output signal of said reading means, the clock generated by the loop circuit section being supplied to said A/D converter as a sampling clock therefor;

wherein said PLL circuit has a first delay means for delaying the clock generated by said loop circuit section and then supplying the clock to said A/D converter; and second delay means for delaying the clock generated by said loop circuit section and then supplying the clock to said phase comparator.

9. A recording and playback apparatus as claimed in claim 8, wherein a relative delay is provided between the clock supplied to said A/D converter through said first delay means and the clock supplied to said phase comparator through said second delay means.

10. A recording and playback apparatus comprising:

reading means for reading recorded information from a recording medium;

an A/D converter for subjecting an output signal of said reading means to A/D conversion; and a PLL circuit having a loop circuit section including a phase comparator, a loop filter, and a voltage controlled oscillator for generating a clock on the basis of the output signal of said reading means, the clock generated by the loop circuit section being supplied to said A/D converter as a sampling clock therefor;

wherein said PLL circuit has control means for determining if a level of the output signal of said reading means is at or lower than a specified level during a search and then holding a PLL operation of said loop circuit section on the basis of a result of the determination; first delay means for delaying the clock generated by said loop circuit section and then supplying the clock to said A/D converter; and second delay means for delaying the clock generated by said loop circuit section and then supplying the clock to said phase comparator.

11. A recording and playback apparatus as claimed in claim 10, wherein a relative delay is provided between the clock supplied to said A/D converter through said first delay means and the clock supplied to said phase comparator through said second delay means.

* * * * *